(12) United States Patent
Kitagawa et al.

(10) Patent No.: US 11,189,772 B2
(45) Date of Patent: Nov. 30, 2021

(54) THERMOELECTRIC POWER GENERATOR

(71) Applicant: DENSO CORPORATION, Kariya (JP)

(72) Inventors: Shinya Kitagawa, Kariya (JP);
Yoshiyuki Okamoto, Kariya (JP);
Takuya Matsuda, Kariya (JP)

(73) Assignee: DENSO CORPORATION, Kariya (JP)

( * ) Notice: Subject to any disclaimer, the term of this patent is extended or adjusted under 35 U.S.C. 154(b) by 644 days.

(21) Appl. No.: 16/070,810

(22) PCT Filed: Dec. 16, 2016

(86) PCT No.: PCT/JP2016/087502
§ 371 (c)(1),
(2) Date: Jul. 18, 2018

(87) PCT Pub. No.: WO2017/126263
PCT Pub. Date: Jul. 27, 2017

(65) Prior Publication Data
US 2021/0066568 A1    Mar. 4, 2021

(30) Foreign Application Priority Data

Jan. 21, 2016   (JP) .............................. JP2016-010071
Nov. 30, 2016   (JP) .............................. JP2016-232202

(51) Int. Cl.
*H01L 35/32*     (2006.01)
*H01L 35/30*     (2006.01)
*F01N 5/02*      (2006.01)

(52) U.S. Cl.
CPC .............. *H01L 35/32* (2013.01); *F01N 5/025* (2013.01); *H01L 35/30* (2013.01)

(58) Field of Classification Search
CPC .......... H01L 35/32; H01L 35/30; F01N 5/025
See application file for complete search history.

(56) References Cited

U.S. PATENT DOCUMENTS

2011/0265465 A1* 11/2011 Oesterle ............... B21D 26/033
60/320
2012/0298163 A1   11/2012 Brehm et al.
(Continued)

FOREIGN PATENT DOCUMENTS

CN        203456512 U    2/2014
DE    102010035724 A1    3/2012
(Continued)

OTHER PUBLICATIONS

U.S. Appl. No. 16/070,824, filed Jul. 18, 2018, Kitagawa et al.

*Primary Examiner* — Jayne L Mershon
(74) *Attorney, Agent, or Firm* — Harness, Dickey & Pierce, P.L.C.

(57) ABSTRACT

A thermoelectric power generator includes: a pipe in which a first fluid flows; a power generation module including a thermoelectric conversion element; and a holding member that is in contact with a one side part of the power generation module, such that heat of a second fluid that is higher in temperature than the first fluid transfers to the one side part of the power generation module. The holding member holds the power generation module and the pipe in a heat transferable state, such that the pipe is in contact with the other side part of the power generation module. The thermoelectric power generator includes a heat conductive component interposed between the holding member and the pipe to define a heat transfer course through which heat transfers from the second fluid to the first fluid, at downstream of the power generation module in a flowing direction of the second fluid.

13 Claims, 6 Drawing Sheets

(56) References Cited

U.S. PATENT DOCUMENTS

2014/0034102 A1 2/2014 Ranalli et al.
2015/0075160 A1 3/2015 An et al.

FOREIGN PATENT DOCUMENTS

| JP | 2015057547 A | | 3/2015 |
| JP | 2016023625 | * | 2/2016 |
| WO | WO-2007026432 A1 | | 3/2007 |
| WO | WO-2017047562 A1 | | 3/2017 |

* cited by examiner

THERMOELECTRIC POWER GENERATOR

CROSS REFERENCE TO RELATED APPLICATIONS

This application is a U.S. National Phase Application under 35 U.S.C. 371 of International Application No. PCT/JP2016/087502 filed on Dec. 16, 2016 and published in Japanese as WO 2017/126263 A1 on Jul. 27, 2017. This application is based on and claims the benefit of priority from Japanese Patent Application No. 2016-010071 filed on Jan. 21, 2016, and Japanese Patent Application No. 2016-232202 filed on Nov. 30, 2016. The entire disclosures of all of the above applications are incorporated herein by reference.

TECHNICAL FIELD

The present disclosure relates to a thermoelectric power generator which transforms thermal energy into electric power energy by the Seebeck effect.

BACKGROUND ART

In a thermoelectric power generator, a power generation performance is determined based on a multiplication value of a heat recovery amount and a power generation efficiency. Further, the heat recovery amount and the power generation efficiency are in a relation of a trade-off. In order to get high power generation performance, it is necessary to increase the multiplication value of the heat recover amount and the power generation efficiency. The heat recover amount, at this time, falls compared with a heat recovery equipment without thermoelectric power generation. When the heat recover amount is decreased, for example, the performance for warming up the engine may be lowered at the engine start time.

Then, an exhaust heat use system of Patent Literature 1 is equipped with a bypass channel for exhaust gas, a thermoelectric conversion element affixed to the exterior of an exhaust pipe, a first exhaust gas passage in which the exhaust gas passes to heat the cooling water, and a first valve that opens and closes the first exhaust gas passage. The system is further equipped with a second exhaust gas passage defined between the inner circumference side of the exhaust pipe and the outer circumference side of the bypass channel, and a second valve arranged at the rear end of the bypass channel to open and close the bypass channel.

In the system, at an initial starting time of a vehicle, the first valve opens the first exhaust gas passage, and the second valve closes the bypass channel. Since the exhaust gas flows through the first exhaust gas passage to heat the cooling water, the exhaust heat is collected.

At the driving time of the vehicle, the first valve closes the first exhaust gas passage, and the second valve closes the bypass channel. The exhaust gas flows through the second exhaust gas passage, and heats one side of the thermoelectric conversion element. Therefore, a difference in temperature occurs between the sides of the thermoelectric conversion element, and electric power is generated inside of the thermoelectric conversion element by this difference in temperature. The electric power produced by the thermoelectric conversion element charges a battery.

When the vehicle is driven with overload, the first valve closes the first exhaust gas passage, and the second valve opens the bypass channel. A small amount of the exhaust gas flows in the second exhaust gas passage, and most of the exhaust gas flows in the bypass channel. Thus, most of the exhaust gas flows in the bypass channel by bypassing the thermoelectric conversion element.

PRIOR ART LITERATURES

Patent Literature

Patent Literature 1: JP 2015-57547 A

SUMMARY OF INVENTION

The system of Patent Literature 1 tries to solve an issue of a lowering in the heat recover amount by changing the use state of heat from a high temperature fluid, in response to the driving mode of the vehicle, by switching the channel of the high temperature fluid. However, since the system of Patent Literature 1 needs components for the channel change, the device configuration becomes complicated, and a control for the channel change is also needed.

It is an object of the present disclosure to provide a thermoelectric power generator having high performance in both of the heat recovery and the power generation by easy configuration.

Technical means different from each other are used to attain each purpose of embodiments, in the present disclosure. Marks in parenthesis in the claims represent examples to show correspondence relation with the concrete means of the embodiments, and do not limit the technical scope.

According to an aspect of the present disclosure, a thermoelectric power generator includes: a pipe in which a first fluid flows; a power generation module including a thermoelectric conversion element; a holding member that is in direct or indirect contact with a one side part of the power generation module, such that heat of a second fluid that is higher in temperature than the first fluid transfers to the one side part of the power generation module, the holding member holding the power generation module and the pipe in a heat transferable state, such that the pipe is in direct or indirect contact with the other side part of the power generation module; and a heat conductive component that is thermally conductive to define a heat transfer course between the holding member and the pipe, through which heat transfers from the second fluid to the first fluid. The heat conductive component is interposed between the holding member and the pipe, at a downstream side of the power generation module in a flowing direction of the second fluid.

According to the thermoelectric power generator, since the heat conductive component defines the heat transfer course at downstream of the power generation module in the flow of the second fluid, the heat of the second fluid can be transferred to the pipe through the heat conductive component after being transferred to the power generation module through the holding member. Thereby, the heat recovery amount from the second fluid to the first fluid can be increased, compared with a conventional equipment in which the heat of the second fluid is transferred to the pipe through the power generation module over the entire flow of the second fluid. Furthermore, since the second fluid gives thermal energy to the power generation module before the heat is collected to the first fluid through the heat conductive component, a predetermined heat amount to be converted to electric energy in the power generation module can be secured, so as to secure a power generation performance. Moreover, the thermoelectric power generator can keep the balance between the power generation performance and the heat collection performance, by properly setting the heat recovery amount through the heat conductive component at the downstream side. Therefore, the thermoelectric power generator excellent in both of the heat collection performance and the power generation performance can be offered with the simple configuration.

According to an aspect of the present disclosure, a thermoelectric power generator includes: a pipe in which a first fluid flows; a plurality of power generation modules, each of which including a thermoelectric conversion element; a holding member that holds the power generation module and the pipe in a heat transferable state, the holding member being in direct or indirect contact with a one side part of the power generation module, such that heat of a second fluid that is higher in temperature than the first fluid transfers to the one side part of the power generation module, the pipe being in direct or indirect contact with the other side part of the power generation module; and a heat conductive component that is thermally conductive to define a heat transfer course between the holding member and the pipe, through which heat transfers from the second fluid to the first fluid. The heat conductive component is interposed between the holding member and the pipe, at least one location between the power generation modules arranged in a flowing direction of the second fluid.

Accordingly, since the heat conductive component defines the heat transfer course between the power generation modules, heat can be transferred to the pipe through the heat conductive component after heat is transferred from the second fluid to the power generation module through the holding member at the upstream side of the heat conductive component. Thereby, the heat recovery amount from the second fluid to the first fluid can be increased, compared with a conventional equipment in which the heat of the second fluid is transferred to the pipe through the power generation module over the entire flow of the second fluid. Furthermore, since the second fluid gives thermal energy to the power generation module at the upstream side of the location where the heat is collected to the first fluid through the heat conductive component, a predetermined heat amount to be converted to electric energy in the power generation module can be secured, so as to secure a power generation performance. Moreover, the thermoelectric power generator can keep the balance between the power generation performance and the heat collection performance, by properly setting the heat recovery amount through the heat conductive component between the power generation modules. Therefore, the thermoelectric power generator excellent in both of the heat collection performance and the power generation performance can be offered with the simple configuration.

DESCRIPTION OF EMBODIMENTS

Figure 1:
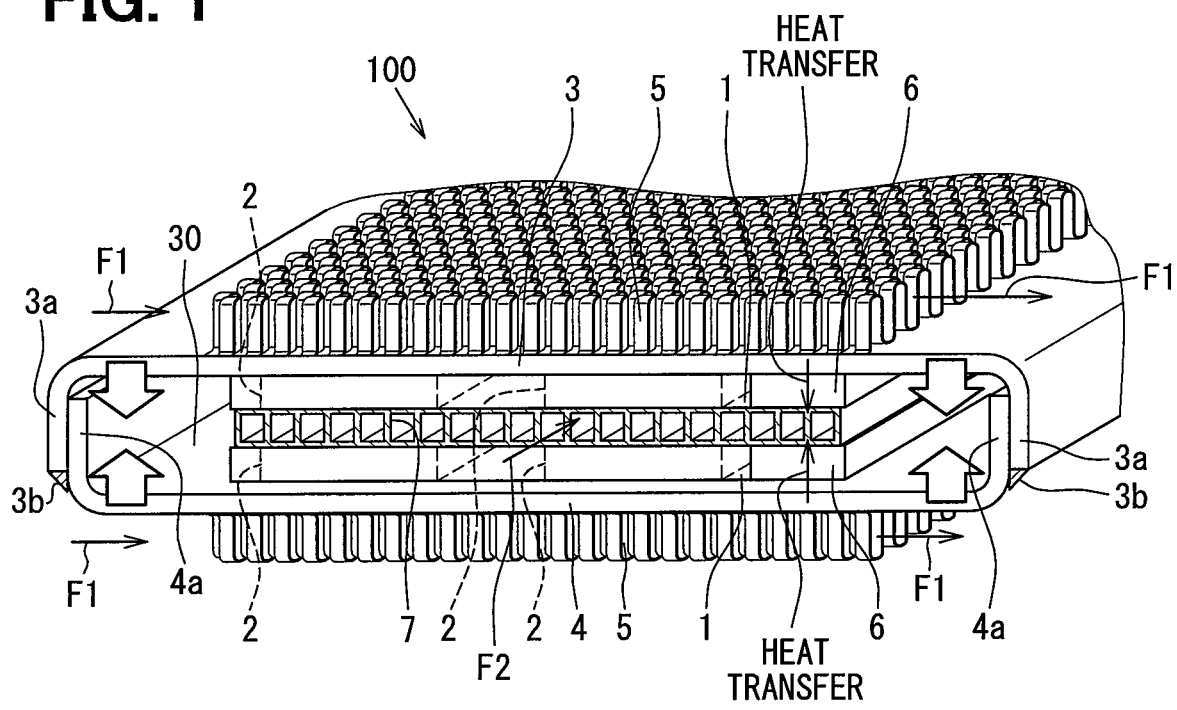
FIG. 1 is a perspective view illustrating a part of a thermoelectric power generator according to a first embodiment.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A thermoelectric power generator 100 of a first embodiment is described with reference to FIG. 1-FIG. 6. The thermoelectric power generator 100 is an equipment which can transform thermal energy into electric power energy by the Seebeck effect. When a difference in temperature is generated between one side and the other side in a power generation module having a thermoelectric conversion element, the thermoelectric power generator 100 generates electric power using phenomenon in which electrons flow due to potential difference. The difference in temperature is generated between the one side and the other side of the power generation module using a first fluid having low temperature and a second fluid having high temperature higher than the first fluid in the thermoelectric power generator 100. The first fluid and the second fluid are selected to provide the difference in temperature. In this embodiment, for example, the cooling water of an engine for a vehicle is used as the first fluid, and exhaust gas exhausted from the engine is used as the second fluid. Hereafter, the first fluid may be referred as low-temperature fluid and the second fluid may be referred as high-temperature fluid higher in temperature than the low-temperature fluid.

The thermoelectric power generator 100 has a first passage through which the high-temperature fluid flows, a second passage through which the low-temperature fluid flows, a power generation module 1, and a heat conductive component 6. Heat is transferable between one side of the power generation module 1 and the high-temperature fluid, and is transferable between the other side of the power generation module 1 and the low-temperature fluid. The heat conductive component 6 facilitates the heat exchange between each fluid and the power generation module 1. The thermoelectric power generator 100 further has a first holding member 3 and a second holding member 4 to raise the tightness between the components for securing heat transfer between the low-temperature fluid and the power generation module 1 and between the high-temperature fluid and the power generation module 1. The first holding member 3 and the second holding member 4 are also called as a holding member 3, 4 below.

The heat conductive component 6 is made of a material by which heat conduction is possible by itself. The heat conductive component 6 is made of a thermally conductive material, for example, metal such as aluminum or copper, graphite, or resin including a thermally conductive material. The heat conduction performance of the heat conductive component 6 may preferably be higher than the heat conduction performance of the power generation module 1.

The heat conductive component 6 may have a board shape, a solid block shape, or a flat rectangular parallelepiped shape. The heat conductive component 6 may be preferably formed to able to be in tight contact between the first holding member 3 and the pipe 7, and between the second holding member 4 and the pipe 7. The heat conductive component 6 may preferably have a volume and an outer shape similar to the power generation module 1. The heat conductive component 6 may preferably have a thickness similar to the power generation module 1.

Each power generation module 1 has the thermoelectric conversion elements 2 stored inside a case having a flat box shape. As shown in FIG. 1, the thermoelectric conversion elements 2 are housed in the power generation module 1 and arranged in the flowing direction F1 of the high-temperature fluid. For preventing the oxidation of the thermoelectric conversion elements 2, for example, the inside of the case is in vacuumed state or is filled with inactive gas. The internal space of the case is air-tightly sealed. The case is made of, for example, stainless steel material.

The thermoelectric conversion element 2 includes P type semiconductor device and N type semiconductor device alternately arranged and connected with each other like mesh. The power generation module 1 has the one side in contact with the high-temperature fluid or a high temperature section which is able to transfer heat with the high-temperature fluid, and the other side in contact with the low-temperature fluid or a low temperature section which is able to transfer heat with the low-temperature fluid. A difference in temperature arises between the one side and the other side of the thermoelectric conversion element 2, and electric power is generated by electrons moved by the potential difference.

The one side of the power generation module 1 located on one side in the thermoelectric power generator 100 is in contact with the first holding member 3 that corresponds to the high temperature section, and the other side is in contact with the pipe 7 that corresponds to the low temperature section. The one side of the power generation module 1 located on the other side in the thermoelectric power generator 100 is in contact with the pipe 7 which corresponds to the low temperature section, and the other side is in contact with the second holding member 4 that corresponds to the high temperature section. Each of the holding members 3 and 4 may be formed by a plate-shape member. The first holding member 3 may be in contact with the one side of the power generation module 1 indirectly through another component. The second holding member 4 may be in contact with the one side of the power generation module 1 indirectly through another component.

The end of the first holding member 3 and the end of the second holding member 4 are shaped to be welded to each other, for example, formed by casting or bending. The first holding member 3 has a joint part 3a defined at the both ends located on the tip side than the bent part which is angled with approximately right angle. The second holding member 4 has a joint part 4a defined at the both ends located on the tip side than the bent part which is angled with approximately right angle. The joint part 3a and the joint part 4a overlap with each other to form an overlap part extending in a direction parallel to the flowing direction F2 of the low-temperature fluid which flows in the pipe 7. At this overlap part, the joint part 3a and the joint part 4a are welded with each other by, for example, seam welding or laser welding. The pipe 7 is held between the two power generation modules 1 and between the two heat conductive components 6 by the compressive force provided from the first holding member 3 and the second holding member 4. The compressive force is a power acting in directions shown in blank arrows in FIG. 1.

The two heat conductive components 6 are held to support the pipe 7 therebetween at the downstream of the two power generation modules 1 in the flowing direction F1 of the high-temperature fluid. Thus, the two heat conductive components 6 are positioned at the most downstream in the entire flow of the high-temperature fluid, in which heat is transferred from the high-temperature fluid to the low-temperature fluid. Each of the heat conductive components 6 is positioned at the most downstream in the range where the heat transfer is performed between the first passage and the second passage. Each heat conductive component 6 defines a heat transfer course which thermally connects the first passage and the second passage at the most downstream in the flow of the high-temperature fluid. The heat conductive component 6 has the same length as the power generation module 1 in the flowing direction F2, and is positioned upstream of the thermoelectric conversion element 2 in the flow of the high-temperature fluid.

The heat conductive component 6 is held by the compressive force, and has no fixing structure fixed to each of the pipe 7, the first holding member 3, and the second holding member 4. That is, the heat conductive component 6 is able to be displaced in the flowing direction F1 of the high-temperature fluid, relative to the pipe 7, the first holding member 3, and the second holding member 4, according to an expansion and a contraction of each component. Therefore, if each component expands and contracts by a difference in temperature caused by the high-temperature fluid and the low-temperature fluid, since the heat conductive component 6 can be displaced, stress caused by distortion of each component can be reduced, and a thermal expansion difference between components can be absorbed.

The interior space 30 is formed between the first holding member 3 and the second holding member 4 joined with each other by welding, as a space surrounded by the first holding member 3 and the second holding member 4. The two power generation modules 1 and the pipe 7 are stored in the interior space 30.

The pipe 7 is made of, for example, stainless steel or aluminum, and includes the second passage divided into plural internal passages through which the low-temperature fluid flows inside. Outer fins 5 are formed on the surface of the first holding member 3 opposite from the power generation module 1. Outer fins 5 are formed on the surface of the second holding member 4 opposite from the power generation module 1. The outer fins 5 are located in the first passage through which the high-temperature fluid flows, and the high-temperature fluid is in contact with the outer fins 5.

The thermoelectric power generator 100 of the first embodiment includes the pipe 7 and the two power generation modules 1. The pipe 7 is interposed between the two power generation modules 1. The pipe 7 has flat external surfaces on the back and the front, and the low-temperature fluid flows inside the pipe 7. The power generation module 1 includes the thermoelectric conversion element 2, and is in contact with the external surface of the pipe 7. The first holding member 3 made of an iron plate or a stainless plate is in contact with a surface of one power generation module 1 located opposite from the pipe 7. The second holding member 4 made of an iron plate or a stainless plate is in contact with a surface of the other power generation module 1 located opposite from the pipe 7. The outer fin 5 made from stainless steel or aluminum is joined by brazing to the surface of the first holding member 3 located opposite from the power generation module 1. The outer fin 5 made from stainless steel or aluminum is joined by brazing to the surface of the second holding member 4 located opposite from the power generation module 1.

The outer fin 5 is formed by bending a plate material to have wave shape. The rigidity of the outer fin 5 is low in the wave advancing direction, and is high in the wave overlapping direction. The rigidity of the first holding member 3 can be raised by brazing the outer fin 5 on the first holding member 3. As a result, a gap which restricts heat transfer is hardly generated between the first holding member 3 and the power generation module 1 and between the second holding member 4 and the power generation module 1. Further, a gap which restricts heat transfer is hardly generated between the first holding member 3 and the heat conductive component 6 and between the second holding member 4 and the heat conductive component 6.

A heat conductive component such as a graphite sheet or grease which has thermal conductivity may be placed at the contact part where the gap may be generated. Some vertical intervals or unevenness, which may cause the gap at the contact part, can be absorbed by preparing such a heat conductive component in the contact part, to secure the thermal conductivity.

The outer fin 5 is an offset fin, and the offset fins positioned adjacent to each other in the direction F1 are offset with a predetermined distance in a direction perpendicular to the direction F1. The outer fin 5 has plural wave parts in which the wave advancing direction corresponds to the flowing direction F2 of the low-temperature fluid, and the wave overlapping direction corresponds to the flowing direction F1 of the high-temperature fluid.

Accordingly, the high-temperature fluid easily flows between the waves, and the outer fin 5 can raise the rigidity in the flowing direction F1 of the high-temperature fluid. As a result, the rigidity of the first holding member 3 and the second holding member 4 to which the outer fin 5 is joined can also be raised in the flowing direction F1. The first holding member 3 and the second holding member 4 have the joint part 3a and the joint part 4a, respectively, at the both ends in the flowing direction F1, and the joint part 3a and the joint part 4a are welded with each other. A stress which forces the power generation module 1 and the heat conductive component 6 onto the pipe 7 is generated by welding the joint part 3a and the joint part 4a. The rigidity over this stress can be raised by the outer fin 5, such that the tightness between the components can be secured.

Figure 4:
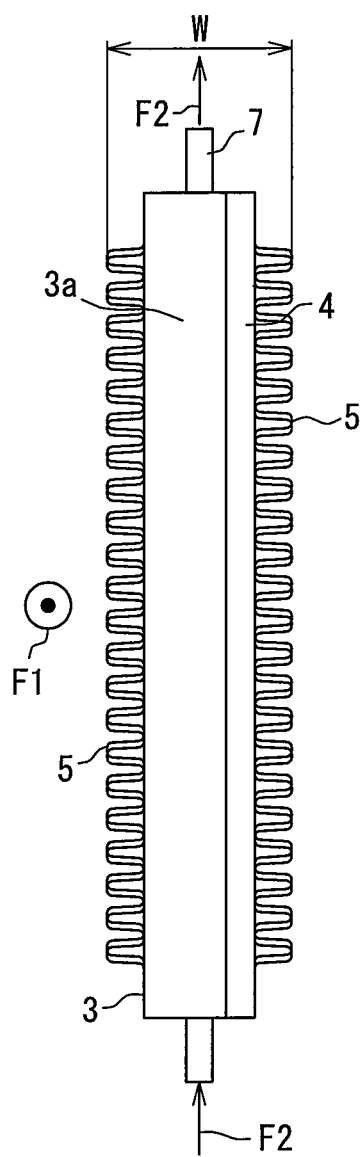
FIG. 4 is a side view illustrating the thermoelectric power generator seen in an arrow direction IV of FIG. 3.

The first holding member 3 and the second holding member 4 in the joined state are set to have length in the flowing direction F1, in a range, for example, between 130 mm and 200 mm. The pipe 7 supported between the first holding member 3 and the second holding member 4, and the outer fin 5 are set to have length in the flowing direction F1, in a range, for example, between 85 mm and 155 mm. The pipe 7 is set to have length of, for example, about 160 mm in the flowing direction F2. The thermoelectric power generator 100 is set to have a length W in the stacking direction, which is shown in FIG. 4, for example, of about 35 mm between the tip ends of the outer fins 5.

The first holding member 3 and the second holding member 4 are pressed in the directions shown by blank arrows of FIG. 1, at an assembling time, to increase the overlap between the joint part 3a and the joint part 4a. In this pressed state, the joint part 3a and the joint part 4a are welded with each other by seam welding or laser welding.

Thereby, the first holding member 3 and the second holding member 4 produce the stress supporting both sides of the power generation module 1. Furthermore, the power generation module 1 and the heat conductive component 6 are in tight contact with both the holding member 3, 4 and the pipe 7. This pressurizing power acts between the pipe 7 and the power generation module 1, and between the power generation module 1 and the holding member 3, 4, to define the contact part between the components. Moreover, the pressurizing power acts between the pipe 7 and the heat conductive component 6 and between the heat conductive component 6 and the holding member 3, 4, to define the contact part between the components.

The joint part 3a and the joint part 4a are welded by seam welding or laser welding to form a weld part extended along the flowing direction of the low-temperature fluid. Accordingly, the joint part 3a and the joint part 4a can be welded firmly. Furthermore, the weld part may be formed on a tip surface 3b of the joint part 3a.

Figure 2:
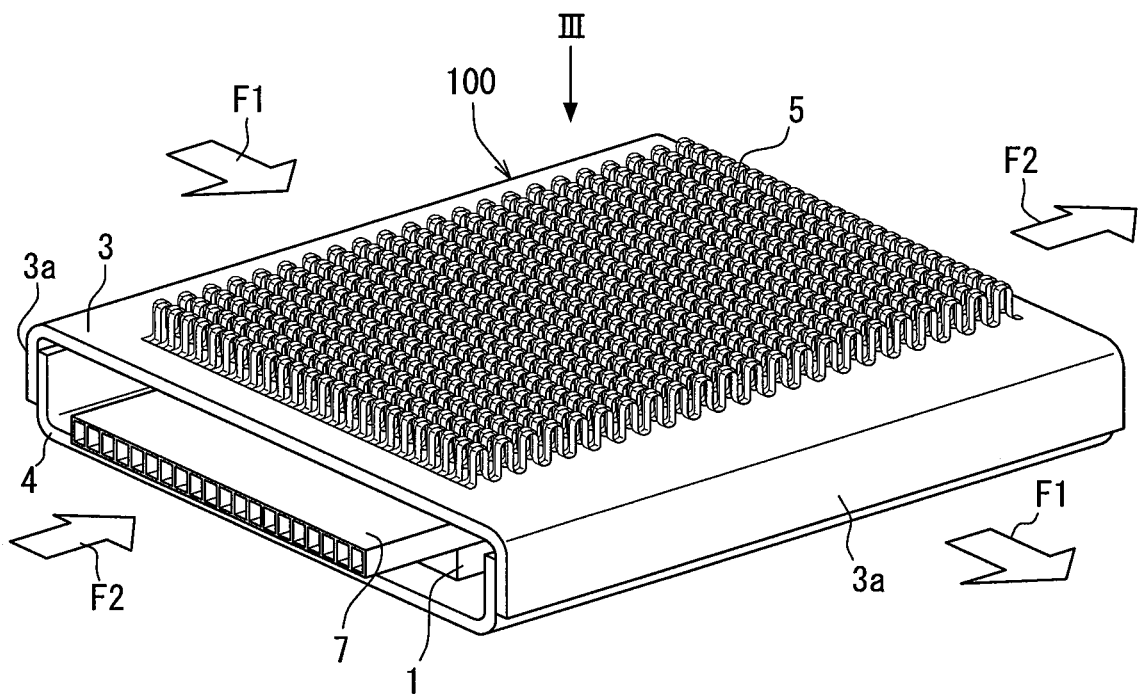
FIG. 2 is a perspective view illustrating the thermoelectric power generator.
Figure 3:
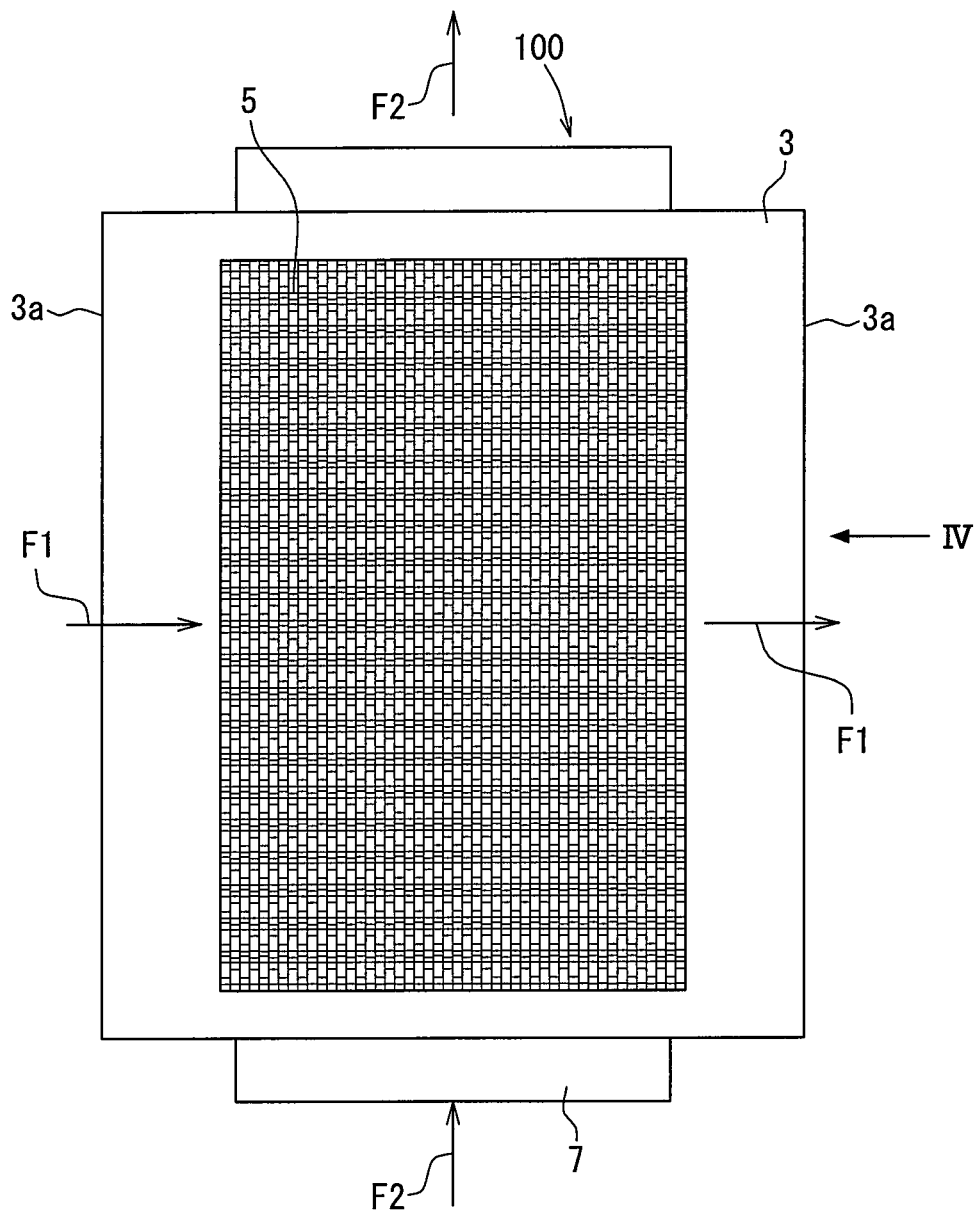
FIG. 3 is a plan view illustrating the thermoelectric power generator seen in an arrow direction III of FIG. 2.

The thermoelectric power generator 100 configures a stacking object in which the outer fin 5, the first holding member 3, the power generation module 1 and the heat conductive component 6, the pipe 7, the power generation module 1 and the heat conductive component 6, the second holding member 4, and the outer fin 5 are stacked in this order from the upper side to the lower side in FIG. 1. For example, the low-temperature fluid flows in the direction perpendicular to the flow of the high-temperature fluid, as shown in FIG. 2-FIG. 4. The rigidity of the outer fin 5 is low in the wave extending direction such that the outer fin 5 is easily expanded and contracted in the wave extending direction. The rigidity of the outer fin 5 is high in a direction perpendicular to the wave extending direction, such that the outer fin 5 is difficult to expand and contract in this perpendicular direction.

A bending stress is applied to the first holding member 3 and the second holding member 4 due to the pressurizing force in the direction shown by the blank arrows of FIG. 1. For this reason, it is desirable to have a rigidity that can withstand the bending stress. Therefore, the outer fin 5 is set to raise the rigidity in the flowing direction F1 of the high-temperature fluid, and to lower the rigidity in the perpendicular direction perpendicular to the direction F1.

The first holding member 3 and the second holding member 4 are elastically deformed by being bent on the outer side of the end of the power generation module 1. For this reason, the tight contact is securable among the power generation module 1, the heat conductive component 6, the first holding member 3, the second holding member 4, and the pipe 7 by the reaction force of the first holding member 3 and the second holding member 4 trying to return to the original position due to the elastic deformation, while maintaining the contact part at the end of the power generation module 1.

Figure 5:
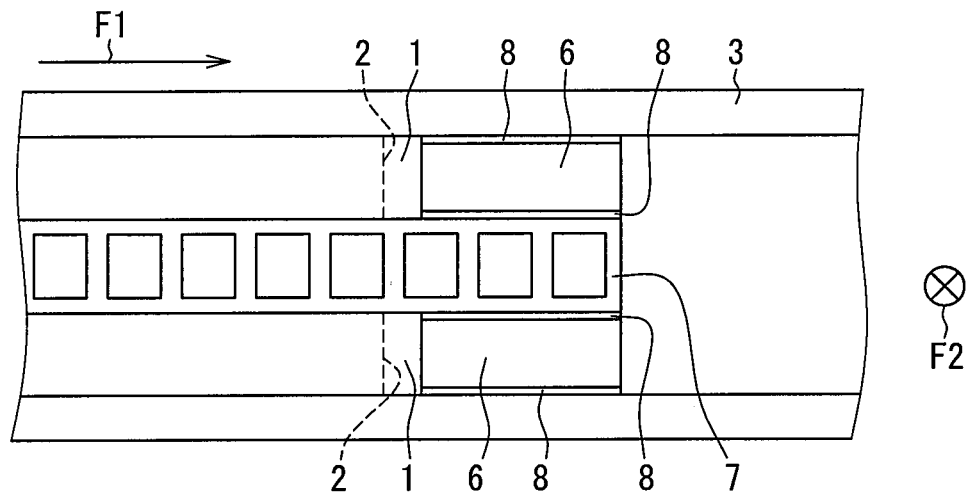
FIG. 5 is an enlarged view illustrating a heat conductive component located downstream of a power generation module in a flow of high-temperature fluid.

As shown in FIG. 5, it is desirable to interpose a grease or a graphite sheet which has thermal conductivity, as a thermal connection component 8, between the heat conductive component 6 and the pipe 7, between the heat conductive component 6 and the first holding member 3, and between the heat conductive component 6 and the second holding member 4. The thermal resistance between the components can be reduced by the thermal connection component 8, to realize efficient heat transfer between the high-temperature fluid and the low-temperature fluid through the heat conductive component 6.

The graphite sheet has very high thermal conductivity. For example, the graphite sheet may have more than twice of the thermal conductivity of copper or aluminum. The graphite sheet is thin and flexible, and is easy to deform and processing. The graphite sheet may be manufactured by thermally cracking a high polymer film. It is desirable that the graphite sheet has high degree of orientation close to a single crystal structure.

Moreover, it is desirable that hardness of the thermal connection component 8 is low such that it is easily deformed by external force, than the heat conductive component 6, the pipe 7, the first holding member 3, and the second holding member 4. Since the thermal connection component 8 can be deformed according to expansion and contraction of each component, the heat conductive component 6 can be easily displaced relative to the pipe 7, the first holding member 3, and the second holding member 4. Therefore, if each component expands and contracts by a difference in temperature caused by the high-temperature fluid and the low-temperature fluid, since the heat conductive component 6 is easily displaced, a stress caused by distortion of each component is effectively reduced, and a thermal expansion difference between components is effectively absorbed.

Figure 6:
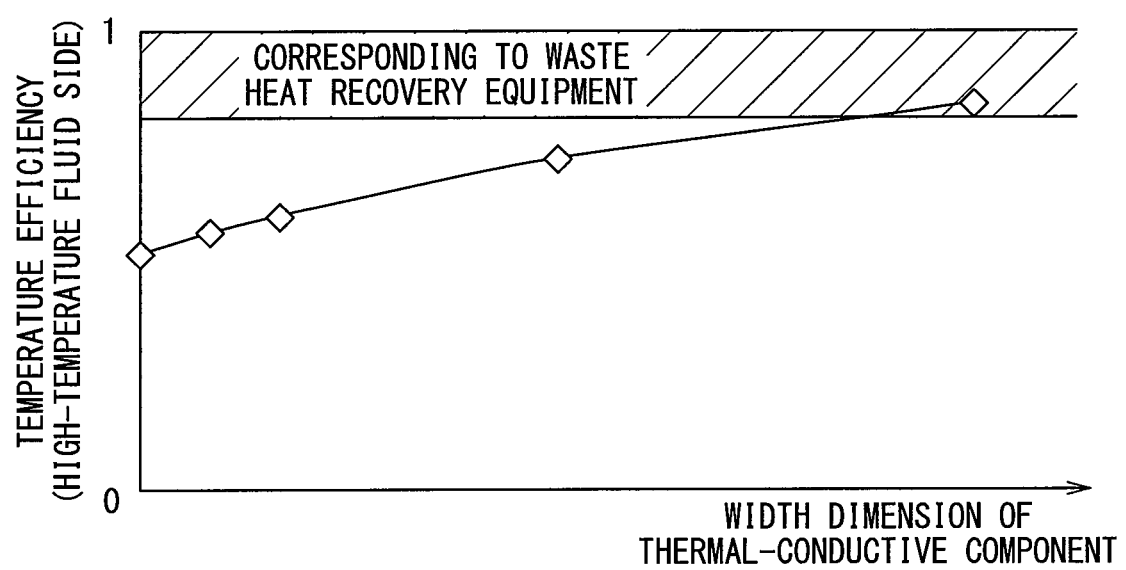
FIG. 6 is a graph for explaining a relation between a width dimension of the heat conductive component and a temperature efficiency on the high-temperature fluid side, in the thermoelectric power generator.

Next, a relation between a width dimension of the heat conductive component 6 in the flowing direction F1 and the temperature efficiency of the high-temperature fluid, in the thermoelectric power generator 100, is explained, with reference to FIG. 6. The graph shown in FIG. 6 is based on actually measured data when the width dimension of the heat conductive component 6 in the flowing direction F1 is changed in the thermoelectric power generator 100. This temperature efficiency is calculated by dividing a value calculated by subtracting the outlet temperature from the inlet temperature of the high-temperature fluid with a value calculated by subtracting the inlet temperature of the low-temperature fluid from the inlet temperature of the high-temperature fluid. That is, the temperature efficiency on the side of the high-temperature fluid is calculated by dividing the difference in temperature of the high-temperature fluid between the upstream and the downstream of the heat exchange by a maximum temperature difference between the high-temperature fluid and the low-temperature fluid. When this temperature efficiency is high, the heat recovery performance from the high-temperature fluid to the low-temperature fluid becomes high.

A plot when the width dimension of the heat conductive component 6 is zero in FIG. 6 represents a temperature efficiency of a thermoelectric power generator in which no power generation module is provided entirely in the flowing direction of the second fluid. In the thermoelectric power generator 100, heat movement between the high-temperature fluid and the low-temperature fluid is promoted through the heat conductive component 6 at the downstream of the power generation module 1 in the flow of high-temperature fluid. Thereby, the high-temperature fluid which flowed into the first passage radiates heat to the thermoelectric conversion element 2 to give thermal energy, and then, radiates heat to the low-temperature fluid through the heat conductive component 6. Therefore, the thermoelectric power generator 100 can secure the power generation performance by firstly giving thermal energy of the high-temperature fluid to be changed into electric energy, and then, can collect heat to the low-temperature fluid through the heat conductive component 6 and the pipe 7 at the downstream side.

As shown in FIG. 6, the temperature efficiency in the thermoelectric power generator 100 becomes high as the width dimension of the heat conductive component becomes long. A hatching area in FIG. 6 represents a temperature efficiency corresponding to an exhaust heat recovery equipment which does not have a function of thermoelectric power generation. In FIG. 6, when the width dimension of the heat conductive component is increased, the temperature efficiency approaches the temperature efficiency of this exhaust heat recovery equipment. The heat recovery performance can be improved by setting the width dimension of the heat conductive component longer, while the electric power is generated.

Next, the advantages achieved by the thermoelectric power generator 100 of the first embodiment are explained. The thermoelectric power generator 100 includes the pipe 7 in which the first fluid flows, the power generation module 1 including the thermoelectric conversion element 2, and the holding member that is in direct or indirect contact with one side part of the power generation module so that the heat of the second fluid, that is higher in temperature than the first fluid, transfers to the one side part of the power generation module. The holding member holds the power generation module 1 and the pipe 7 in the state where heat can transfer so that the pipe 7 is in direct or indirect contact with the other side part of the power generation module 1. Furthermore, the thermoelectric power generator 100 includes the heat conductive component 6 which has thermal conductivity and interposed between the holding member and the pipe 7 to define the heat transfer course through which heat transfers to the first fluid from the second fluid. The heat conductive component 6 is supported between the holding member and the pipe 7 at the downstream of the power generation module 1 and the thermoelectric conversion element 2 in the flowing direction of the second fluid.

According to the thermoelectric power generator 100, the heat conductive component 6 defines the heat transfer course at the downstream of the power generation module 1 in the flow of second fluid. Therefore, heat of the second fluid can be transferred to the power generation module 1 through the holding member, and then, heat of the second fluid can be further transferred to the pipe 7 through the heat conductive component 6. That is, the heat recovery to the first fluid is increased at the downstream side in the flow of second fluid, and a difference in temperature can be secured at the upstream side by giving heat to the power generation module 1. Thereby, the amount of heat collected from the second fluid to the first fluid can be increased, because there is a heat course which does not pass through the power generation module 1, compared with a conventional equipment in which heat of the second fluid is moved to the pipe 7 through the power generation module 1 over the entire flow of the second fluid.

Furthermore, the second fluid gives thermal energy to the power generation module 1 before the heat is collected to the first fluid through the heat conductive component 6. Thereby, the amount of heat to be converted to electric energy can be secured in the power generation module 1, such that the power generation performance can be secured. Moreover, the thermoelectric power generator 100 can keep the balance between the power generation performance and the heat recovery performance, by properly setting the heat recovery amount through the heat conductive component 6 on the downstream side. Accordingly, the thermoelectric power generator 100 can achieve high performance both in the heat recovery and the power generation by easy configuration. For example, a mechanism in connection with a channel change is unnecessary for the thermoelectric power generator 100. Therefore, the number of components, the product weight, and the product physique can be reduced.

The thermoelectric power generator 100 offers the holding force holding the stacked object in which the heat conductive component 6, the power generation module 1, and the pipe 7 are stacked. Specifically, the stacked object is formed by stacking, relative to the pipe 7, the heat conductive component 6 and the power generation module 1 on the one side of the pipe 7, and by stacking the heat conductive component 6 and the power generation module 1 on the other side of the pipe 7. That is, the plural power generation modules 1 hold the pipe 7 by the holding force by the first holding member 3 and the second holding member 4. The plural heat conductive components 6 hold the pipe 7 by the holding force by the first holding member 3 and the second holding member 4.

According to the thermoelectric power generator 100, heat can be collected from the second fluid, on both sides of the pipe 7 in which the first fluid flows, and the power generation can be carried out by the power generation module 1. Therefore, the thermoelectric power generator 100 can be provided to achieve high efficiency both in the power generation and the heat collection, and can keep the good balance between the power generation performance and the heat recovery performance.

Second Embodiment

Figure 7:
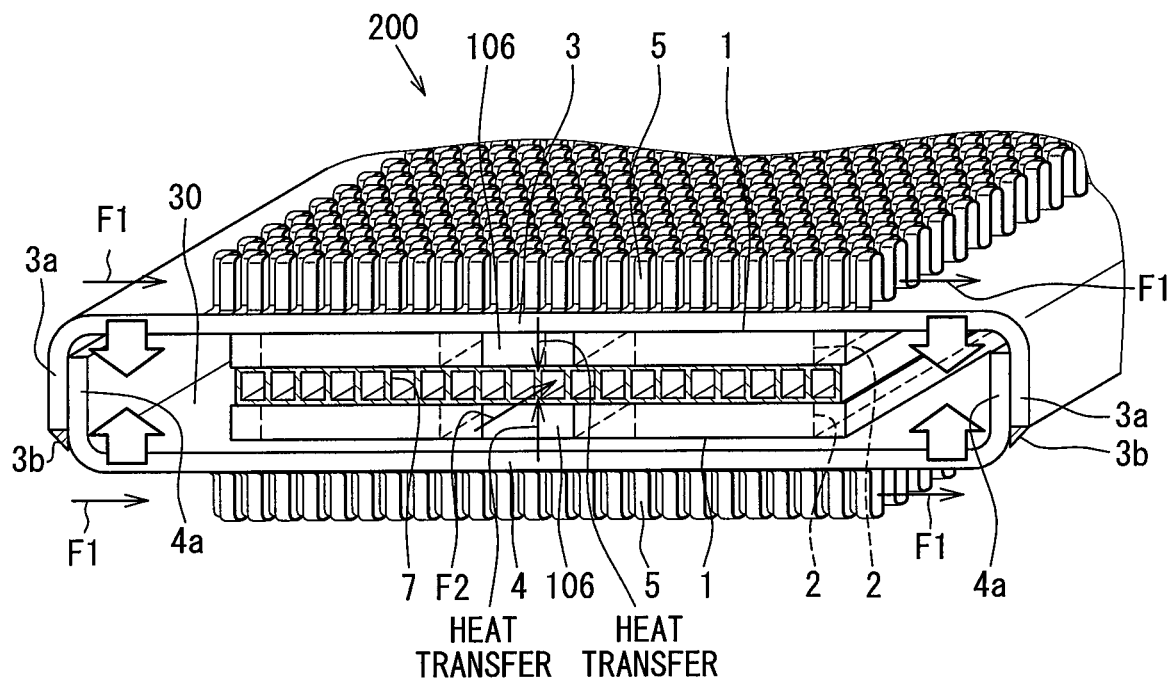
FIG. 7 is a perspective view illustrating a part of a thermoelectric power generator according to a second embodiment.

A second embodiment is described with reference to FIG. 7. A configuration having the same reference numeral as the first embodiment in FIG. 7 is the same as that of the first embodiment. The configuration, processing, action, and effect not particularly explained in the second embodiment are the same as the first embodiment. Hereafter, only points different from the first embodiment are explained.

A thermoelectric power generator 200 of the second embodiment is different from the thermoelectric power generator 100 of the first embodiment in that a heat conductive component 106 is disposed between the power generation module 1 and the power generation module 1. The heat conductive component 106 has the same configuration and is made of the same material as the heat conductive component 6 to generate the same action and effect.

The thermoelectric power generator 200 includes the heat conductive component 106 which has thermal conductivity. The heat conductive component 106 is interposed between the holding member and the pipe 7, and defines the heat transfer course for heat to move from the second fluid to the first fluid. The heat conductive component 106 is supported between the holding member and the pipe 7 at least one location between the power generation module 1 and the power generation module 1 arranged in the flowing direction of the second fluid.

According to the thermoelectric power generator 200, the heat conductive component 106 defines the heat transfer course at the location between the power generation module 1 and the power generation module 1 arranged in the flowing direction of the second fluid. Therefore, the heat of the second fluid transfers to the power generation module 1 through the holding member, and then, can further transfer to the pipe 7 through the heat conductive component 106. On the further downstream side, the heat of the second fluid transfers to the power generation module 1 through the holding member. That is, the heat recovery to the first fluid can be increased on the downstream side of the power generation module 1, and it is possible to secure a difference in temperature by giving heat to the power generation module 1 at the upstream side and the downstream side. Therefore, the amount of heat collected from the second fluid to the first fluid can be increased, since a heat course which does not pass through the power generation module 1 can be defined between the power generation module 1 and the power generation module 1, compared with a conventional equipment in which the heat of the second fluid is moved to the pipe 7 through the power generation module 1 over the entire flow of the second fluid.

Furthermore, the second fluid gives thermal energy to the power generation module 1 before the heat of the second fluid is collected to the first fluid through the heat conductive component 106. Thereby, the amount of heat to be converted to electric energy can be secured in the power generation module 1, to secure the power generation performance. Moreover, the thermoelectric power generator 200 can keep better balance between the power generation performance and the heat recovery performance, by setting properly the amount of heat collected through the heat conductive component 106 between the power generation modules 1. Accordingly, the thermoelectric power generator 200 can achieve high performance both in the heat recollection and the power generation by easy configuration. For example, a mechanism in connection with a channel change is unnecessary for the thermoelectric power generator 200, such that the number of components, the product weight, and the product physique can be reduced.

The heat conductive component 106 of the thermoelectric power generator 200 may be interposed between the holding member and the pipe 7, all of the locations between the power generation module 1 and the power generation module 1 arranged in the flowing direction of the second fluid. Since the heat conductive component 106 is formed at each location between the plural power generation modules 10, the thermoelectric power generator 200 can provide high heat recovery amount while the power generation performance is secured. Moreover, since the thermoelectric power generator 200 has plural heat transfer courses through the plural heat conductive components 106, it is easy to control the heat recovery amount to approach a proper value.

Third Embodiment

Figure 8:
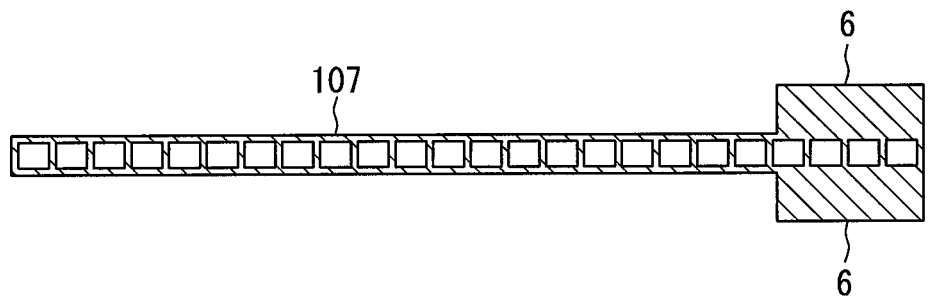
FIG. 8 is a sectional view illustrating a heat conductive component according to a third embodiment.

A third embodiment is described with reference to FIG. 8. A configuration having the same reference numeral as the first embodiment in FIG. 8 is the same as that of the first embodiment. The configuration, processing, action, and effect not particularly explained in the third embodiment are the same as the first embodiment. Hereafter, only points different from the first embodiment are explained.

A pipe 107 of the third embodiment is different from the pipe 7 of the first embodiment in that the heat conductive component 6 is integrally formed with the pipe 107. The pipe 107 integrally includes the heat conductive component 6 projected from the respective sides of the pipe 107 at the downstream end in the flowing direction F1. The heat conductive component 6 in the pipe 107 is located downstream of the power generation module 1 in the flow of high-temperature fluid in the state where the power generation module 1 is in the tight contact with the respective sides of the pipe 107. The pipe 107 may be formed, for example, by extrusion molding.

The heat conductive component 6 and the pipe 107 may be integrally formed as one component, in contrast to the pipe 7 of the second embodiment. In this case, the pipe 107 integrally has the heat conduction component 6 projected from both sides of the pipe 107 between the power generation module 1 and the power generation module 1 arranged in the flowing direction F1. The heat conduction component 6 is located between the plural power generation modules 1 held in the tight contact with the respective sides of the pipe 107.

Since the heat conductive component 6 and the pipe 107 are integrally formed as one component, according to the third embodiment, the heat resistance can be reduced in the heat transfer course from the high-temperature fluid to the low-temperature fluid. Therefore, since the heat collection performance through the heat conductive component 6 can be improved, the temperature of the thermoelectric conversion element 2 can be restricted from exceeding the upper limit temperature, to suppress thermal deterioration of the thermoelectric conversion element 2.

Fourth Embodiment

Figure 9:
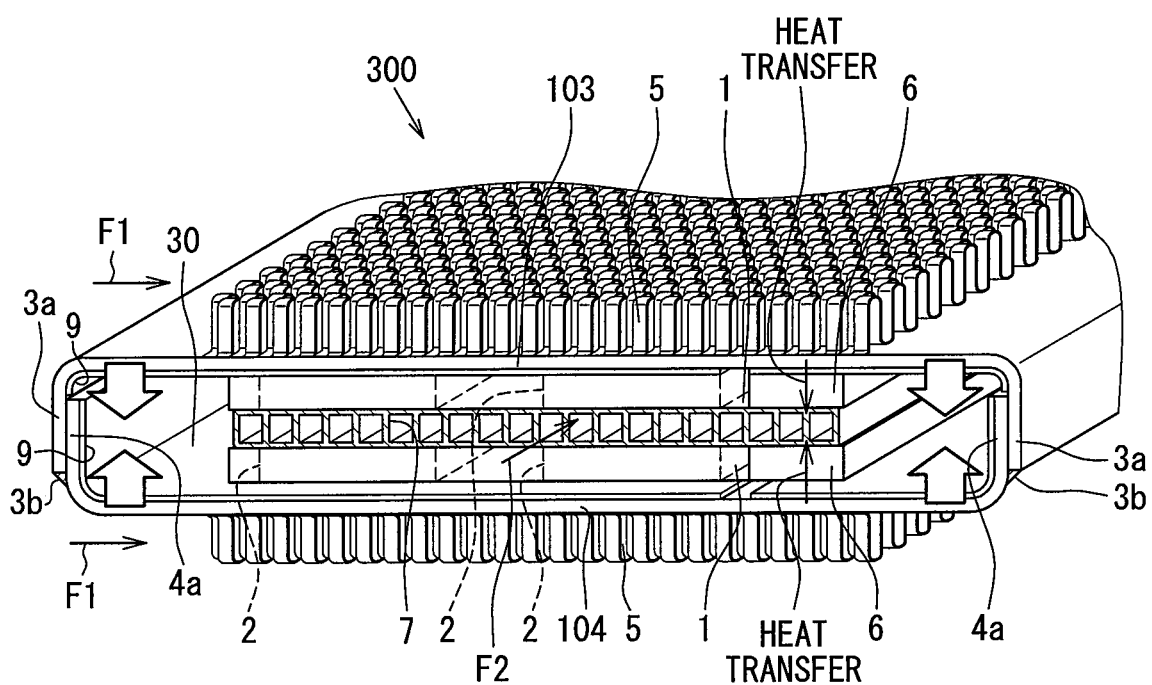
FIG. 9 is a perspective view illustrating a part of a thermoelectric power generator according to a fourth embodiment.
Figure 10:
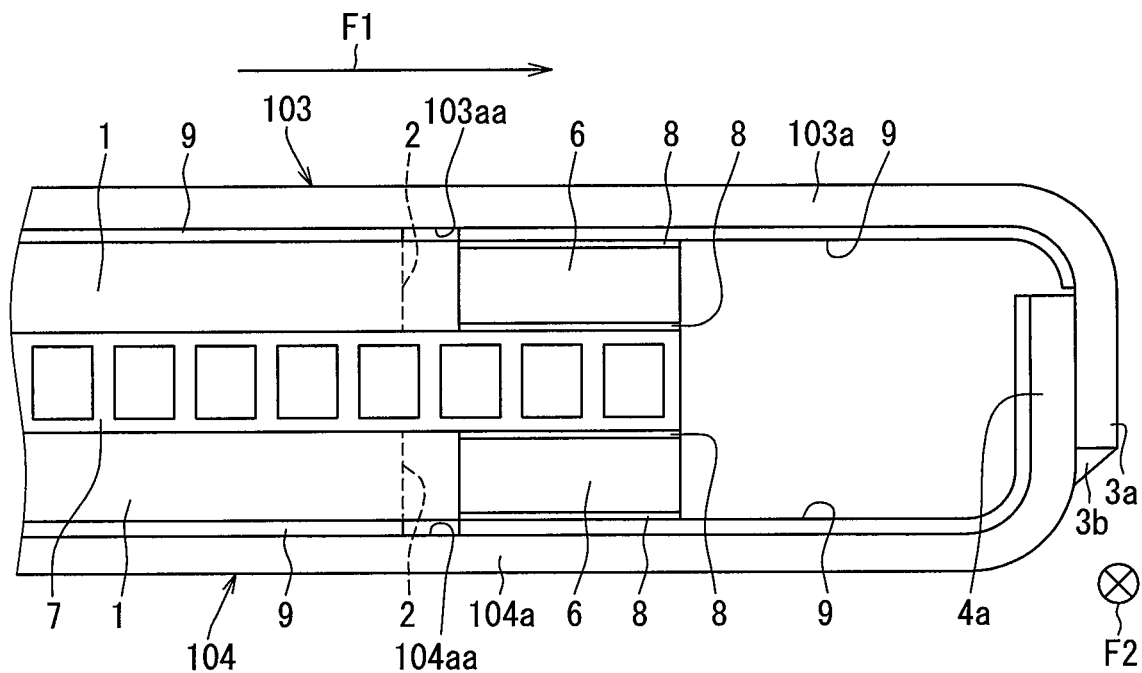
FIG. 10 is an enlarged view illustrating a heat conductive component and a joint part.

A thermoelectric power generator 300 of a fourth embodiment is described with reference to FIG. 9 and FIG. 10. A configuration having the same reference numeral as the first embodiment is the same as that of the first embodiment. The configuration, processing, action, and effect not particularly explained in the fourth embodiment are the same as the first embodiment. Hereafter, only points different from the first embodiment are explained.

As shown in the drawings, a first holding member 103 and a second holding member 104 are respectively different from the first holding member 3 and the second holding member 4, and have stacking configuration in which the materials are different.

The first holding member 103 is made of a cladding material including a base material 103a and a high thermal conductivity material 9 with thermal conductivity higher than the base material 103a. The high thermal conductivity material 9 is joined to the surface of the base material 103a in contact with the one side part of the power generation module 1 and to the surface of the base material 103a in contact with the heat conductive component 6. The cladding material is formed by joining one predetermined metal layer surface and another metal layer surface with applying pressure, and rolling. The cladding material is also called as a clad metal. Since the metals are joined between atoms by pressure, the surfaces of the metals do not easily exfoliate, even if not using adhesives.

The first holding member 103 includes plural layers made of different materials, e.g., the base material 103a and the high thermal conductivity material 9. The high thermal conductivity material 9 of the first holding member 103 contacts the heat conductive component 6 directly, or contacts the heat conductive component 6 indirectly through the thermal connection component 8, to be in contact with the power generation module 1. The heat of the high-temperature fluid transfers to the base material 103a directly or through the outer fin 5, and transfers to the high thermal conductivity material 9 from the base material 103a. Further, the heat is transferred to the heat conductive component 6 or the power generation module 1 through the high thermal conductivity material 9. The heat transfer speed of the high-temperature fluid, which flows outside of the first holding member 103, toward the downstream in the flowing direction F1 is different between in the state where the heat is transmitted to the base material 103a and in the state where the heat is transmitted to the high thermal conductivity material 9. In other words, the heat transmitted to the base material 103a is easily transferred to the high thermal conductivity material 9 from the base material 103a, compared with the heat transmitted inside of the base material 103a to the downstream side. The heat transmitted to the high thermal conductivity material 9 tends to transfer inside of the high thermal conductivity material 9 to the downstream side more quickly than the heat which transfers inside of the base material 103a to the downstream side. Thereby, the first holding member 103 has characteristics in which the heat of the high-temperature fluid transmitted to the upstream side of the first holding member 103 is easily transferred to the heat conductive component 6 or the power generation module 1 on the downstream side due to the high thermal conductivity material 9 at a position near the one side part of the power generation module 1.

The first holding member 103 is not equipped with the high thermal conductivity material 9 at a location 103aa between the thermoelectric conversion element 2 and the heat conductive component 6, of the surface in direct or indirect contact with the one side of the power generation module 1 and the heat conductive component 6. Therefore, a clearance is defined at the location 103aa between the base material 103a and the power generation module 1 without a contact. The location 103aa forms a clearance part between the base material 103a and the power generation module 1 by the thickness of the high thermal conductivity material 9. Therefore, the heat transfer from the base material 103a to the power generation module 1 is restricted in the location 103aa, and the heat transfer course along the high thermal conductivity material 9 to the downstream side is broken. The first holding member 103 may be formed in advance not to have the high thermal conductivity material 9 at the location 103aa, or may be formed by cutting to remove the high thermal conductivity material 9 at the location 103aa after the high thermal conductivity material 9 is provided on the location 103aa.

The second holding member 104 is formed of a cladding material including the base material 104a and the high thermal conductivity material 9 with thermal conductivity higher than the base material 104a. The high thermal conductivity material 9 is joined to the surface of the base material 104a in contact with the one side part of the power generation module 1 and the surface of the base material 104a in contact with the heat conductive component 6. The second holding member 104 includes plural layers made of different materials, e.g., the base material 104a and the high thermal conductivity material 9. The high thermal conductivity material 9 of the second holding member 104 is in direct contact with the heat conductive component 6, or contacts the heat conductive component 6 indirectly through the thermal connection component 8, so as to be in contact with the power generation module 1. The heat of the high-temperature fluid transfers to the base material 104a directly or through the outer fin 5, transfers to the high thermal conductivity material 9 from the base material 104a, and transfers to the heat conductive component 6 or the power generation module 1 through the high thermal conductivity material 9. The heat transfer speed of the high-temperature fluid, which flows outside of the second holding member 104, to the downstream side in the flowing direction F1 is different between in the state where the heat is transmitted to the base material 104a and in the state where the heat is transmitted to the high thermal conductivity material 9. In other words, the heat transmitted to the base material 104a is easily transferred to the high thermal conductivity material 9 from the base material 104a than moving inside of the base material 104a to the downstream side. The heat transmitted to the high thermal conductivity material 9 tends to transfer inside of the high thermal conductivity material 9 to the downstream side more quickly than the heat which transfers inside of the base material 104a to the downstream side. Thereby, the second holding member 104 has characteristics in which the heat of the high-temperature fluid transmitted to the upstream side of the second holding member 104 is easily transferred to the heat conductive component 6 and the power generation module 1 on the downstream side by the high thermal conductivity material 9 at a position near the other side part of the power generation module 1.

The second holding member 104 is not equipped with the high thermal conductivity material 9 at a location 104aa between the thermoelectric conversion element 2 and the heat conductive component 6, of the surface in direct or indirect contact with the one side of the power generation module 1 and the heat conductive component 6. Therefore, a clearance is defined at the location 104aa between the base material 104a and the power generation module 1 without a contact. The location 104aa forms a clearance part between the base material 104a and the power generation modules 1 by the thickness of the high thermal conductivity material 9. Therefore, the heat transfer from the base material 104a to the power generation module 1 is restricted in the location 104aa, and the heat transfer course along the high thermal conductivity material 9 to the downstream side is broken by the location 104aa. The second holding member 104 may be formed in advance not to have the high thermal conductivity material 9 at the location 104aa, or may be formed by cutting to remove the high thermal conductivity material 9 at the location 104aa after the high thermal conductivity material 9 is provided on the location 104aa.

For example, the base material 103a and the base material 104a are made of stainless steel material, and the high thermal conductivity material 9 is made of copper material. The high thermal conductivity material 9 is not provided on the joint part 3a of the first holding member 103. Accordingly, the joint part 3a and the joint part 4a can be joined with each other between the same material, since the base material 103a and the base material 104a are made of the same material, to avoid a junction between different materials. The first holding member 103 may be formed by not covering the joint part 3a with the high thermal conductivity material 9 in advance, or the first holding member 103 may be formed by removing the high thermal conductivity material 9 from the joint part 3a after covering with the high thermal conductivity material 9.

According to the fourth embodiment, the thermoelectric power generator 300 has the first holding member 103 and the second holding member 104 formed by covering the base material 103a and the base material 104a with the material with high thermal conductivity than the base material 103a and the base material 104a on the surface in direct or indirect contact with the one side part of the power generation module 1 and the heat conductive component 6. Accordingly, the high thermal conductivity material 9 facilitates the transfer of heat of the high-temperature fluid moved to the holding member at the downstream side of the heat conductive component 6, to the upstream side. Thereby, the heat transferred to the holding member at the downstream side of the heat conductive component 6 can be collected to the heat conduction component 6 through the high thermal conductivity material 9, and the heat recovery through the heat conduction component 6 can be improved.

Each of the first holding member 103 and the second holding member 104 is made of the cladding material including the base material and the high thermal conductivity material 9 having thermal conductivity higher than the base material and joined to the surface in direct or indirect contact with the one side part of the power generation module 1 and the heat conductive component 6. Accordingly, the holding member which achieves the above-described effects can be manufactured by rolling with pressurizing and joining the predetermined different material layers to improve the productivity of the thermoelectric power generator 300.

Each of the first holding member 103 and the second holding member 104 is covered with the material having thermal conductivity higher than that of the base material, on the surface in direct or indirect contact with the one side of the power generation module 1 and the heat conductive component 6, except for the location corresponding between the thermoelectric conversion element 2 and the heat conductive component 6. Therefore, the heat transmitted to the high thermal conductivity material 9 at the upstream of the position corresponding between the thermoelectric conversion element 2 and the heat conductive component 6 can be restricted from moving to the heat conductive component 6 on the downstream side. Thus, the amount of heat collected by the thermoelectric conversion element 2 can be restricted from decreasing. Thereby, the thermoelectric power generator 300 can be offered, by which the power generation efficiency is raised.

Other Embodiment

The disclosure in this description is not restricted to the illustrated embodiment. The disclosure includes the illustrated embodiments and modifications by a person skilled in the art based on the illustrated embodiments. For example, disclosure is not limited to the component and/or the combination of the components shown in the embodiments. The disclosure can be carried out with various combinations. The disclosure may use additional parts which can be added to the embodiments. The disclosure may contain modifications in which component and/or element of the embodiments are removed. The disclosure may contain modifications in which component and/or element of the embodiments are exchanged or combined. Technical scope of disclosure is not limited to the embodiments. It should be understood that some disclosed technical scope may be shown by description in the scope of claim, and contain all modifications which are equivalent to and within description of the scope of claim.

The thermoelectric power generator 100 is broadly applicable also to an apparatus not for a vehicle. For example, the thermoelectric power generator 100 may be combined with an exhaust heat recovery equipment using gas emitted from a boiler for industry or residences as the high-temperature fluid. The thermoelectric power generator 100 is applicable to a portable dynamo, an electric power unit of an electric apparatus, or a dynamo using exhaust heat exhausted from a factory or an incinerator as the high-temperature fluid.

The thermoelectric power generator 100 is not limited to the configuration illustrated in FIG. 1. For example, the thermoelectric power generator 100 may be formed by integrally holding a stacked object by the holding member, in which the heat conductive component 6 and the power generation module 1 arranged in this order in the flowing direction F1 of the second fluid on the one side of the pipe 7 is stacked on the pipe 7. That is, the thermoelectric power generator 100 may have the heat conductive component 6 and the power generation module 1 integrally holding the pipe 7 on only one side of the pipe 7.

The thermoelectric power generator 100 provides one power generation unit in the above embodiment. Alternatively, the thermoelectric power generator 100 may provide plural power generation units stacked with each other. Also in this case, the high-temperature fluid flows in contact with the outer fin 5 located between the power generation units.

The first holding member 3 is smaller than the second holding member 4, and the first holding member 3 is fitted into the second holding member 4 in the embodiment. The first holding member 3 and the second holding member 4 may have the same size, and may be combined with each other as offset.

In the embodiment, the first holding member 3 and the second holding member 4 are welded, and the interior space 30 surrounded by the first holding member 3 and the second holding member 4 is sealed from the outside. However, the first holding member 3 and the second holding member 4 may be not completely sealed, to such an extent that the high-temperature fluid does not have a bad influence on the power generation module 1 in the interior space 30. For example, the first holding member 3 and the second holding member 4 may be combined by spot welding at plural points.

The power generation module 1 of the embodiment may not be covered by a case. The P type semiconductor devices and N type semiconductor devices may be exposed from the interior space 30 surrounded by the first holding member 3 and the second holding member 4. In the thermoelectric power generator 100, a case is not an indispensable component. In this case, it is desirable to seal the interior space 30 with a cover.

The bonded surfaces of the joint part 3a of the first holding member 3 and the joint part 4a of the second holding member 4 are flat in the embodiment. The bonded surfaces may have a concavo-convex form engaged with each other such as saw blade projection or labyrinth form.

In the embodiment, the first holding member 3 and the second holding member 4 are in contact with the power generation module 1 through a planer surface. Alternatively, the first holding member 3 and the second holding member 4 may be in contact with the power generation module 1 through a curved surface. An object excellent in heat conduction, such as a graphite sheet or a thermally conductive grease, may be interposed between the first holding member 3 and the second holding member 4, and the power generation module 1. Moreover, the thickness of the graphite sheet may not be uniform.

In the embodiment, the upstream ends of the pipe 7 and the heat conductive component 6 in the flow of high-temperature fluid may be aligned with each other or located offset from each other.

In the embodiment, the flat pipe 7 which forms the second passage includes plural passages inside, but is not limited to such a form. The pipe 7 may not have the flat shape, and fins may be arranged in the pipe 7.

In the embodiment, the first holding member 3 and the outer fin 5 may be formed integrally as one unit, and the second holding member 4 and the outer fin 5 may be formed integrally as one unit.

In the embodiment, the low-temperature fluid and the high-temperature fluid may form opposite flows flowing reversely from each other.

What is claimed is:

1. A thermoelectric power generator comprising:
   a pipe in which a first fluid flows;
   a power generation module including a thermoelectric conversion element;
   a holding member that holds the power generation module and the pipe in a heat transferable state, the holding member being in direct or indirect contact with a one side part of the power generation module, such that heat of a second fluid that is higher in temperature than the first fluid transfers to the one side part of the power generation module, the pipe being in direct or indirect contact with the other side part of the power generation module; and
   a heat conductive component that is thermally conductive to define a heat transfer course between the holding member and the pipe, through which heat transfers from the second fluid to the first fluid, wherein
   the heat conductive component is interposed between the holding member and the pipe, at a downstream side of the power generation module in a flowing direction of the second fluid;
   the holding member has a covering material having a thermal conductivity that is higher than that of a base material of the holding member, the covering material covering a surface of the base material in direct or indirect contact with the one side part of the power generation module and a surface of the base material in direct or indirect contact with the heat conductive component, and
   the holding member is made of a cladding material having the base material and a high conductivity material, wherein a thermal conductivity of the high conductivity material is higher than that of the base material, and the high conductivity material is joined to the surface of the base material in direct or indirect contact with the one side part of the power generation module and the heat conductive component.

2. The thermoelectric power generator according to claim 1, wherein
   the holding member includes a first holding member and a second holding member, and
   the first holding member and the second holding member hold a stacking object in which the heat conductive component and the power generation module arranged in the flowing direction of the second fluid at one side of the pipe, the pipe, and the heat conductive component and the power generation module arranged in the flowing direction of the second fluid at the other side of the pipe are stacked with each other.

3. The thermoelectric power generator according to claim 1, wherein the heat conductive component is in contact with the holding member through a graphite sheet.

4. The thermoelectric power generator according to claim 1, wherein the heat conductive component is in contact with the holding member through a grease which is thermally conductive.

5. The thermoelectric power generator according to claim 1, wherein the heat conductive component is in contact with the holding member and the pipe through a graphite sheet.

6. The thermoelectric power generator according to claim 1, wherein the heat conductive component and the pipe are integrally formed with each other as one component.

7. The thermoelectric power generator according to claim 1, wherein
the holding member includes an upper holding member having a base and outer fins formed on a surface of the base opposite from the power generation module, and a lower holding member having a base and outer fins formed on a surface of the base opposite from the power generation module, the upper holding member and the lower holding member join together such that the pipe and the power generation module are held together in the heat transferrable state.

8. A thermoelectric power generator comprising:
a pipe in which a first fluid flows;
a plurality of power generation modules, each of which including a thermoelectric conversion element;
a holding member that holds the power generation module and the pipe in a heat transferable state, the holding member being in direct or indirect contact with a one side part of the power generation module, such that heat of a second fluid that is higher in temperature than the first fluid transfers to the one side part of the power generation module, the pipe being in direct or indirect contact with the other side part of the power generation module; and
a heat conductive component that is thermally conductive to define a heat transfer course between the holding member and the pipe, through which heat transfers from the second fluid to the first fluid, wherein
the heat conductive component is interposed between the holding member and the pipe, at least one location between the power generation modules arranged in a flowing direction of the second fluid,
the holding member has a covering material having a thermal conductivity that is higher than that of a base material of the holding member, the covering material covering a surface of the base material in direct or indirect contact with the one side part of the power generation module and a surface of the base material in direct or indirect contact with the heat conductive component, and
the holding member is made of a cladding material having the base material and a high conductivity material, wherein a thermal conductivity of the high conductivity material is higher than that of the base material, and the high conductivity material is joined to the surface of the base material in direct or indirect contact with the one side part of the power generation module and the heat conductive component.

9. The thermoelectric power generator according to claim 8, wherein
the heat conductive component is interposed between the holding member and the pipe at all of locations between the power generation modules arranged in the flowing direction of the second fluid.

10. The thermoelectric power generator according to claim 8, wherein
the holding member includes an upper holding member having a base and outer fins formed on a surface of the base opposite from the power generation module, and a lower holding member having a base and outer fins formed on a surface of the base opposite from the power generation module, the upper holding member and the lower holding member join together such that the pipe and the power generation module are held together in the heat transferrable state.

11. The thermoelectric power generator according to claim 8, wherein
the holding member is covered with a material having a thermal conductivity higher than that of the base material, except for a position corresponding to between the thermoelectric conversion element and the heat conductive component.

12. A thermoelectric power generator comprising:
a pipe in which a first fluid flows;
a power generation module including a thermoelectric conversion element;
a holding member that holds the power generation module and the pipe in a heat transferable state, the holding member being in direct or indirect contact with a one side part of the power generation module, such that heat of a second fluid that is higher in temperature than the first fluid transfers to the one side part of the power generation module, the pipe being in direct or indirect contact with the other side part of the power generation module; and
a heat conductive component that is thermally conductive to define a heat transfer course between the holding member and the pipe, through which heat transfers from the second fluid to the first fluid, wherein
the heat conductive component is interposed between the holding member and the pipe, at a downstream side of the power generation module in a flowing direction of the second fluid,
the holding member has a covering material having a thermal conductivity that is higher than that of a base material of the holding member, the covering material covering a surface of the base material in direct or indirect contact with the one side part of the power generation module and a surface of the base material in direct or indirect contact with the heat conductive component, and
the holding member is covered with a material having a thermal conductivity higher than that of the base material, on a surface of the base material in direct or indirect contact with the one side part of the power generation module and the heat conductive component, except for a position corresponding to between the thermoelectric conversion element and the heat conductive component.

13. The thermoelectric power generator according to claim 12, wherein
the holding member includes an upper holding member having a base and outer fins formed on a surface of the base opposite from the power generation module, and a lower holding member having a base and outer fins formed on a surface of the base opposite from the power generation module, the upper holding member and the lower holding member join together such that the pipe and the power generation module are held together in the heat transferrable state.

* * * * *